United States Patent
Fu et al.

(10) Patent No.: US 10,108,237 B1
(45) Date of Patent: Oct. 23, 2018

(54) HEAT DISSIPATING DEVICE WITH IMPROVED COOLING PERFORMANCE

(71) Applicant: CHAMP TECH OPTICAL (FOSHAN) CORPORATION, Foshan (CN)

(72) Inventors: Meng Fu, Foshan (CN); Qiao-Long Chen, Foshan (CN); Wu-Fei Xu, Foshan (CN)

(73) Assignee: CHAMP TECH OPTICAL (FOSHAN) CORPORATION, Foshan (CN)

( * ) Notice: Subject to any disclaimer, the term of this patent is extended or adjusted under 35 U.S.C. 154(b) by 0 days.

(21) Appl. No.: 15/594,739

(22) Filed: May 15, 2017

(30) Foreign Application Priority Data

Apr. 7, 2017 (CN) .......................... 2017 1 0224027

(51) Int. Cl.
 F28D 15/00 (2006.01)
 G06F 1/20 (2006.01)
 H01L 23/427 (2006.01)
 H01L 23/40 (2006.01)
 F28D 15/04 (2006.01)
 F28D 15/02 (2006.01)

(52) U.S. Cl.
 CPC ............ G06F 1/206 (2013.01); H01L 23/427 (2013.01); *F28D 15/0275* (2013.01); *F28D 15/04* (2013.01); *F28D 15/046* (2013.01); *G06F 1/20* (2013.01); *G06F 1/203* (2013.01); *G06F 2200/201* (2013.01); *H01L 23/40* (2013.01)

(58) Field of Classification Search
 CPC .... F28D 15/04; F28D 15/0275; F28D 15/046; G06F 1/206; H01L 23/427
 USPC ...... 165/104.21, 104.26, 104.33; 29/890.032
 See application file for complete search history.

(56) References Cited

U.S. PATENT DOCUMENTS

| | | | | |
|---|---|---|---|---|
| 7,277,287 B2* | 10/2007 | Chen | ................... | H01L 23/4006 165/104.33 |
| 7,278,470 B2* | 10/2007 | Xia | ..................... | H01L 23/3672 165/104.21 |
| 8,267,157 B2* | 9/2012 | Qin | ..................... | H01L 23/3672 165/104.33 |
| 2005/0141198 A1* | 6/2005 | Lee | ....................... | H01L 23/427 361/700 |

* cited by examiner

*Primary Examiner* — David Teitelbaum
*Assistant Examiner* — Paul Alvare
(74) *Attorney, Agent, or Firm* — ScienBiziP, P.C.

(57) ABSTRACT

A heat dissipating device includes a first copper plate, a second copper plate, a plurality of first heat pipes, a plurality of second heat pipes, and a heat dissipating component. Evaporating sections of the first heat pipes and the second heat pipes are clamped between and thermally connected to the first copper plate and the second copper plate. The second heat pipe, the evaporating section of the first heat pipes, the first copper plate, and the second copper plate are positioned at a bottom surface of the heat dissipating component. The second copper plate is thermally connected to the bottom surface of the heat dissipating component. Condensing sections of the first heat pipes is thermally connected to a top surface of heat dissipating component.

15 Claims, 4 Drawing Sheets

HEAT DISSIPATING DEVICE WITH IMPROVED COOLING PERFORMANCE

FIELD

The subject matter herein generally relates to a heat dissipating device.

BACKGROUND

Electronic packages such as CPUs (central processing units) used in electronic devices generate lots of heat. The heat requires immediate dissipation in order for the CPU and the electronic device to continue to operate stably. Improving cooling performance of a heat sink is necessary.

BRIEF DESCRIPTION OF THE DRAWINGS

Implementations of the present technology will now be described, by way of example only, with reference to the attached figures.

DETAILED DESCRIPTION

Figure 1:
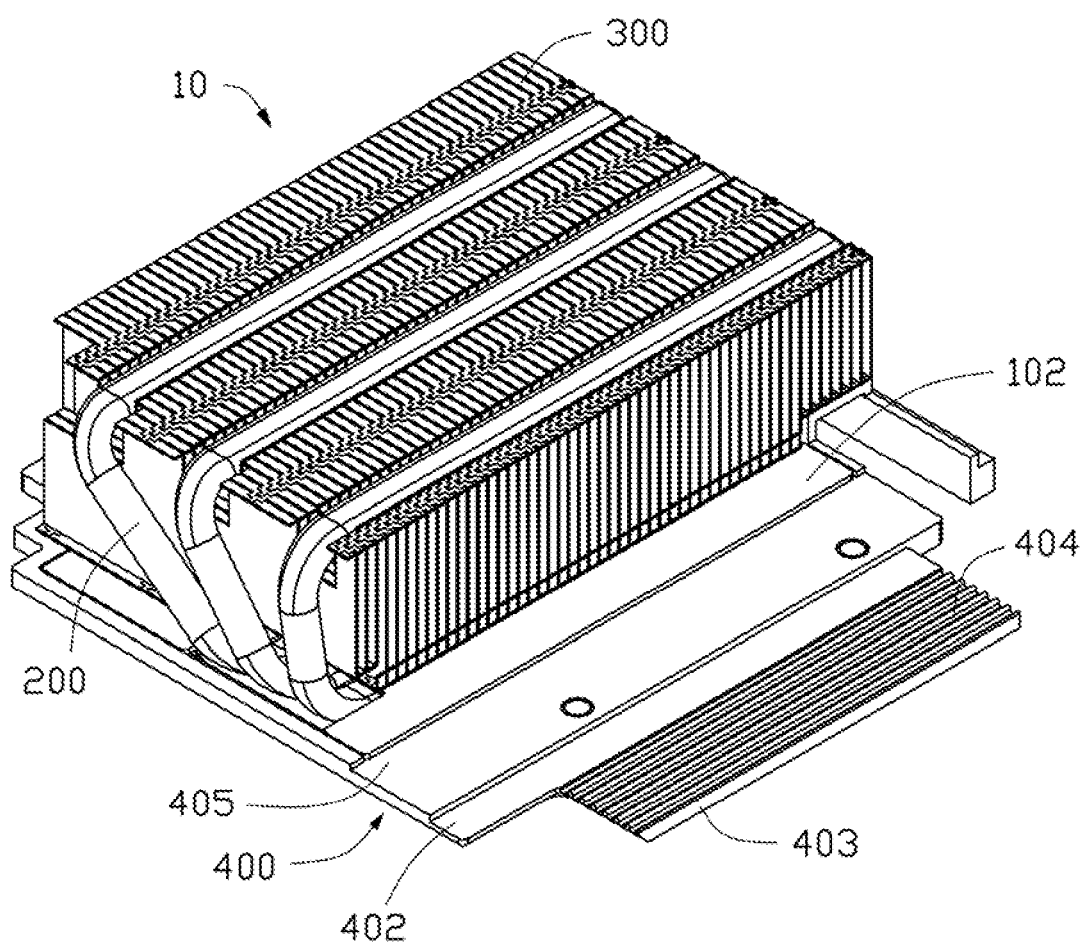
FIG. 1 is an isometric view of a heat dissipating device in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

The term "comprising" when utilized, means "including, but not necessarily limited to"; it specifically indicates open-ended inclusion or membership in the so-described combination, group, series, and the like.

Figure 2:
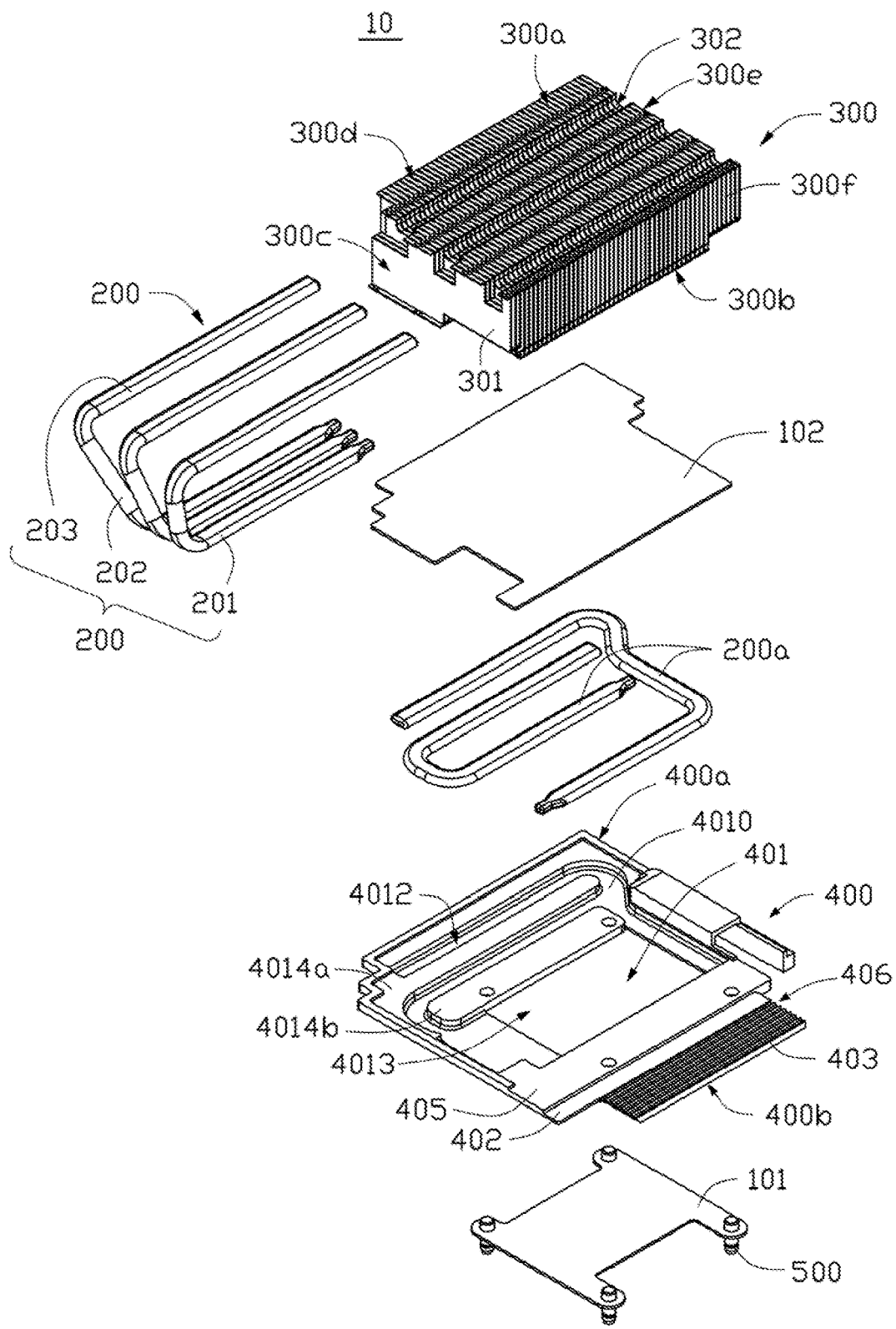
FIG. 2 is an exploded isometric view of the heat dissipating device in accordance with an exemplary embodiment of the present disclosure.
Figure 3:
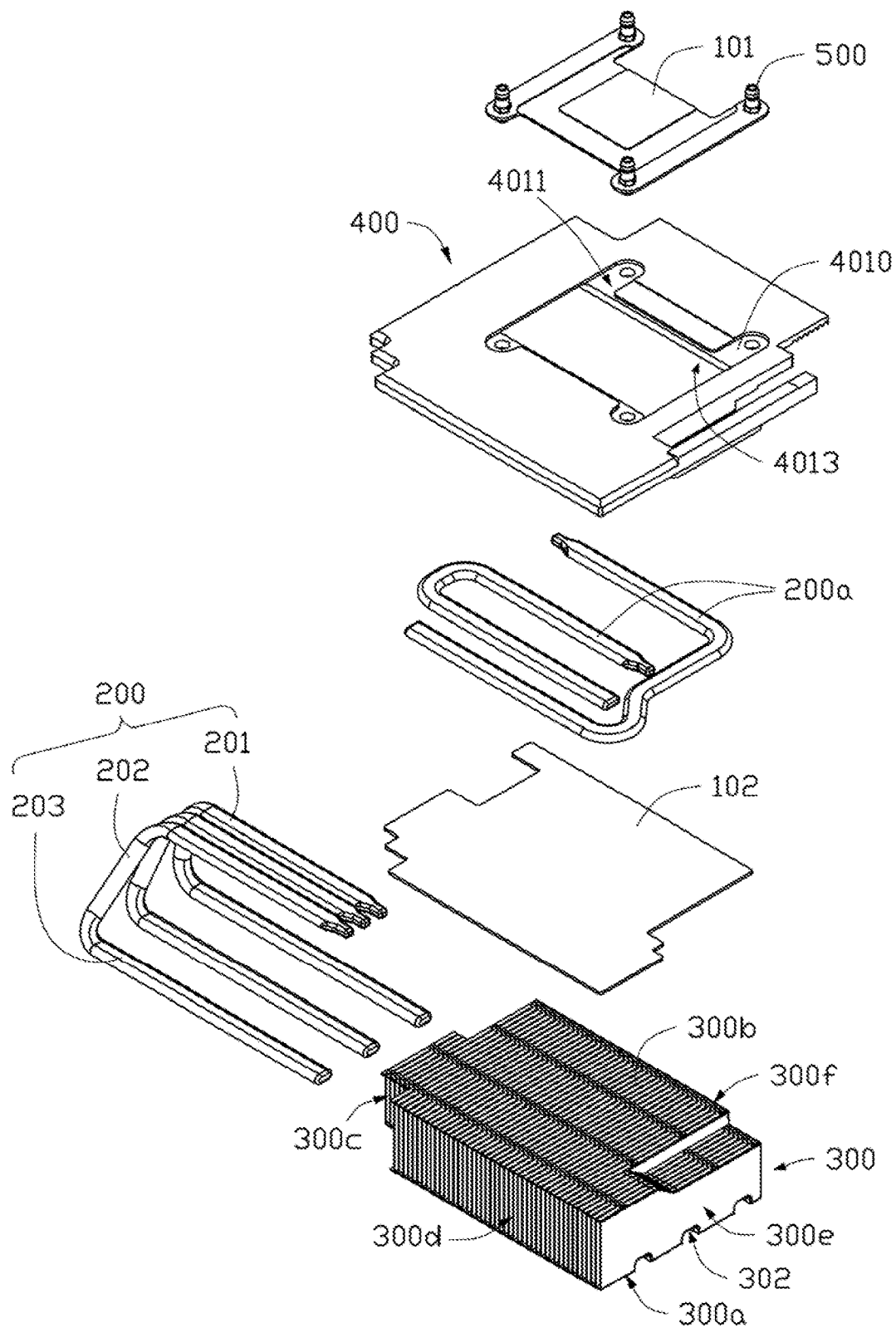
FIG. 3 is another view of the device of FIG. 2.

Referring to FIGS. 1-3, a heat dissipating device 10 comprises a first copper plate 101, a second copper plate 102, a plurality of first heat pipes 200, a plurality of second heat pipes 200a, and a heat dissipating component 300.

The heat dissipating component 300 has a top surface 300a, a bottom surface 300b, and side surfaces 300c/300d/300e/300f. The side surfaces 300c/300d/300e/300f are connected between the top surface 300a and the bottom surface 300b. The side surfaces 300c/300d/300e/300f are respectively a first side surface 300c, a second side surface 300d, a third side surface 300e, and a fourth side surface 300f. The first side surface 300c is opposite to the third side surface 300e. The second side surface 300d is opposite to the fourth side surface 300f.

The heat dissipating component 300 comprises a plurality of first fins 301 as shown in FIG. 2. The first fins 301 are parallel to each other. The first fins 301 are parallel to the first side surface 300c and the third side surface 300e. The first fins 301 are perpendicular to the second side surface 300d and the fourth side surface 300f.

The top surface 300a of the heat dissipating component 300 defines a plurality of grooves 302 between the first side surface 300c and the third side surface 300e. The grooves 302 are recessed from the top surface 300a to the bottom surface 300b. The grooves 302 are perpendicular to the first side surface 300c and the third side surface 300e.

Each first heat pipe 200 has an evaporating section 201, a connecting section 202, and a condensing section 203. The connecting section 202 is connected between the evaporating section 201 and the condensing section 203. Each first heat pipe 200 has a C shape.

The second heat pipes 200a and the evaporating sections 201 of the first heat pipes 200 are clamped between the first copper plate 101 and the second copper plate 102. The second heat pipe 200a and the evaporating section 201 of the first heat pipes 200 are thermally connected to the first copper plate 101 and the second copper plate 102. A heating element (not shown) is thermally connected to a side of the first copper plate 101 opposite to the second copper plate 102.

The second heat pipe 200a, the evaporating section 201 of the first heat pipes 200, the first copper plate 101, and the second copper plate 102 are positioned at the bottom surface 300b of the heat dissipating component 300. The second copper plate 102 is thermally connected to the bottom surface 300b of the heat dissipating component 300. The connecting section 202 of the first heat pipes 200 extends from the evaporating section 201 to the first side surface 300c of the heat dissipating component 300. The condensing section 203 extends from the connecting section 202 to the top surface 300a of the heat dissipating component 300. The condensing section 203 is thermally connected to the top surface 300a. The condensing sections 203 are received in the grooves 302.

The heat dissipating device 10 further comprises a bottom plate 400. The bottom plate 400 has an upper surface 400a facing the heat dissipating component 300 and a lower surface 400b facing away from the heat dissipating component 300. The bottom plate 400 comprises a hole 401 between the upper surface 400a and the lower surface 400b. The first copper plate 101, the second heat pipe 200a, the evaporating section 201 of the first heat pipes 200, and the second copper plate 102 are received in the hole 401.

Referring to FIGS. 2 and 3, a partition board 4010 is positioned in the hole 401. A first receiving portion 4011 and a second receiving portion 4012 are separated by the partition board 4010. The first receiving portion 4011 is defined on the lower surface 400b of the bottom plate 400. The second receiving portion 4012 is defined on the upper surface 400a of the bottom plate 400.

The first copper plate 101 is received in the first receiving portion 4011. A shape of the first receiving portion 4011 corresponds to a shape of the first copper plate 101. The first copper plate 101 can be fastened to the partition board 4010 of the bottom plate 400 by bolts 500. The second copper plate 102, the evaporating section 201 of the first heat pipes 200, and the second heat pipe 200a are received in the second receiving portion 4012.

A channel 4013 is defined in the partition board 4010. The channel 4013 is in air communication with the first receiving portion 4011 and the second receiving portion 4012.

The evaporating section 201 of the first heat pipes 200 are thermally connected to the first copper plate 101 and the second copper plate 102 through the channel 4013. In at least one exemplary embodiment, the evaporating section 201 of the first heat pipes 200 can be soldered to the first copper plate 101 and the second copper plate 102. In at least one exemplary embodiment, the first copper plate 101 can have a protrusion facing the second copper plate 102. The protuberance can extend to the channel 4013. The evaporating section 201 of the first heat pipes 200 can be thermally connected between the first copper plate 101 and the protrusion of the second copper plate 102.

Figure 4:
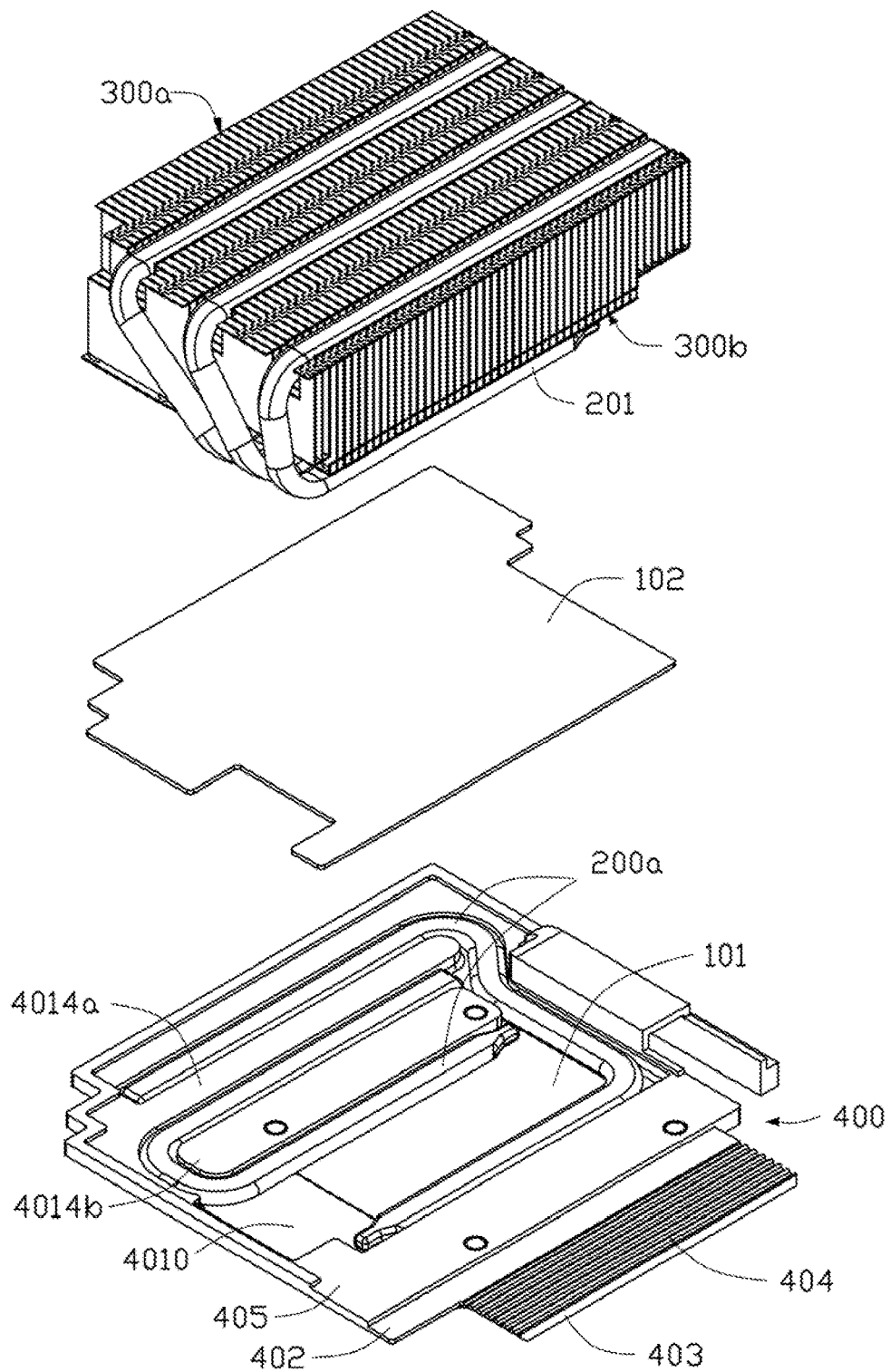
FIG. 4 is an exploded isometric view of a portion of the heat dissipating device in accordance with an exemplary embodiment of the present disclosure.

Referring to FIG. 4, a first embossment 4014a and a second embossment 4014b are formed on the partition board 4010. The second heat pipes 200a are formed on the partition board 4010. The second heat pipes 200a are positioned around the first embossment 4014a and the second embossment 4014b. The second copper plate 102 can be arranged on the first embossment 4014a and the second embossment 4014b. The second copper plate 102 is thermally connected to the first embossment 4014a and the second embossment 4014b.

The bottom plate 400 has an extension 405 formed at one end of the bottom plate 400 away from the heat dissipating component 300. The extension 405 has a first recessed surface 402 formed at one end of the extension 405 away from the heat dissipating component 300. A height of the first recessed surface 402 is less than a height of the bottom plate 400.

The first recessed surface 402 has a second recessed surface 403 formed at one end of the first recessed surface 402 away from the heat dissipating component 300. A height of the second recessed surface 403 is less than the height of the first recessed surface 402. A plurality of second fins 404 is formed on the second recessed surface 403. The second fins 404 are parallel to each other. Each second fin 404 is parallel to each of the first fin 301.

Heat generated from the heating element is transmitted to the first copper plate 101. A first part of the heat is transmitted from the first copper plate 101 to the evaporating section 201 of the first heat pipes 200, and transmitted from the evaporating section 201 of the first heat pipes 200 to the connecting section 202 and then to the condensing section 203, the first part of heat is transmitted to the heat dissipating component 300 and then dissipated by the heat dissipating component 300. A second part of the heat is transmitted from the first copper plate 101 to the evaporating section 201 of the first heat pipes 200 and the second heat pipe 200a, and transmitted from the evaporating section 201 of the first heat pipes 200 and the second heat pipe 200a to the second copper plate 102, the second part of heat is transmitted to the heat dissipating component 300 and then dissipated by the heat dissipating component 300.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A heat dissipating device comprising:
    a first copper plate;
    a second copper plate;
    a plurality of first heat pipes, each first heat pipe comprising an evaporating section, a condensing section, and a connecting section connected between the evaporating section and the condensing section, the evaporating sections being clamped between and being thermally connected to the first copper plate and the second copper plate;
    a plurality of second heat pipes being clamped between and being thermally connected to the first copper plate and the second copper plate;
    a heat dissipating component having a top surface, a bottom surface and a plurality of side surfaces connected between the top surface and the bottom surface, the plurality of side surfaces being a first side surface, a second side surface, a third side surface opposite to the first surface, and a fourth side surface opposite to the second side surface; and
    a bottom plate having an upper surface facing the heat dissipating component and a lower surface facing away from the heat dissipating component, the bottom plate comprising a hole between the upper surface and the lower surface;
    wherein the second heat pipe, the evaporating section of the first heat pipes, the first copper plate, and the second copper plate being positioned at the bottom surface of the heat dissipating component, the second copper plate being thermally connected to the bottom surface of the heat dissipating component, the connecting sections of the first heat pipes extending from the evaporating sections to the first side surface of the heat dissipating component, and the condensing sections extending from the connecting sections to the top surface of the heat dissipating component, the condensing sections being thermally connected to the top surface, the first copper plate, the second heat pipe, the evaporating section of the first heat pipes, and the second copper plate are received in the hole, a partition board is positioned in the hole, a first receiving portion and a second receiving portion are separated by the partition board, the first receiving portion is defined on the lower surface of the bottom plate, and the second receiving portion is defined on the upper surface of the bottom plate.

2. The heat dissipating device of claim 1, wherein each first heat pipe has a C shape.

3. The heat dissipating device of claim 1, wherein the heat dissipating component comprises a plurality of first fins parallel to each other.

4. The heat dissipating device of claim 3, wherein the first fins are parallel to the first side surface and the third side surface, and perpendicular to the second side surface and the fourth side surface.

5. The heat dissipating device of claim 4, wherein the top surface of the heat dissipating component defines a plurality of grooves between the first side surface and the third side surface, the grooves are recessed from the top surface to the bottom surface.

6. The heat dissipating device of claim 5, wherein the grooves are perpendicular to the first side surface and the third side surface.

7. The heat dissipating device of claim 5, wherein the condensing sections are received in the grooves.

8. The heat dissipating device of claim 1, wherein the first copper plate is received in the first receiving portion.

9. The heat dissipating device of claim 8, wherein the second copper plate, the evaporating section of the first heat pipes, and the second heat pipe are received in the second receiving portion.

10. The heat dissipating device of claim 9, wherein a channel is defined in the partition board, the channel is in air communication with the first receiving portion and the second receiving portion, the evaporating sections of the first heat pipes are thermally connected to the first copper plate and the second copper plate through the channel.

11. The heat dissipating device of claim 1, wherein a first embossment and a second embossment are formed on the partition board, the second heat pipes are placed on the partition board and around the first embossment and the second embossment, the second copper plate is arranged on the first embossment and the second embossment.

12. The heat dissipating device of claim 1, wherein the bottom plate has an extension formed at one end of the bottom plate away from the heat dissipating component.

13. The heat dissipating device of claim 12, wherein the extension has a first recessed surface formed at one end of the extension away from the heat dissipating component, a height of the first recessed surface is less than a height of the bottom plate.

14. The heat dissipating device of claim 13, wherein the first recessed surface has a second recessed surface formed at one end of the first recessed surface away from the heat dissipating component, a height of the second recessed surface is less than the height of the first recessed surface.

15. The heat dissipating device of claim 14, wherein a plurality of second fins is formed on the second recessed surface.

* * * * *